(12) United States Patent
Grzelakowski

(10) Patent No.: US 7,126,117 B2
(45) Date of Patent: Oct. 24, 2006

(54) IMAGING ENERGY FILTER FOR ELECTRONS AND OTHER ELECTRICALLY CHARGED PARTICLES AND METHOD FOR ENERGY FILTRATION OF THE ELECTRONS AND OTHER ELECTRICALLY CHARGED PARTICLES WITH THE IMAGING ENERGY FILTER IN ELECTRO-OPTICAL DEVICES

(76) Inventor: Krzysztof Grzelakowski, ul, Uznamska 8, PL-54-315 Wroclaw, Wroclaw (PL)

( * ) Notice: Subject to any disclaimer, the term of this patent is extended or adjusted under 35 U.S.C. 154(b) by 0 days.

(21) Appl. No.: 11/168,728

(22) Filed: Jun. 28, 2005

(65) Prior Publication Data

US 2005/0285032 A1 Dec. 29, 2005

(30) Foreign Application Priority Data

Jun. 28, 2004 (PL) .................................... 368785

(51) Int. Cl.
*H01J 37/05* (2006.01)
*H01J 37/063* (2006.01)

(52) U.S. Cl. ....................... 250/291; 250/305; 250/281

(58) Field of Classification Search ..................... None
See application file for complete search history.

(56) References Cited

U.S. PATENT DOCUMENTS 5,107,111 A * 4/1992 Daimon et al. ............. 250/305

* cited by examiner

*Primary Examiner*—Nikita Wells
(74) *Attorney, Agent, or Firm*—Robert W Becker & Associates; Robert W Becker

(57) ABSTRACT

An imaging energy filter for electrons and other charged particles filters an object formed by these particles at the filter inlet by means of an energetic selection of charged particles in the region of a dispersion aperture. The filter includes two concentric and spherical electrodes, which produce an electrostatic field that deflects the charged particles at an angle $\alpha$ that is greater than $\pi$ and less than $2\pi$. The deflector, operating as a deflecting element that generates a deflection field, is disposed at an intersection point of the inlet axis and the outlet axis and in a plane of symmetry of the angle $\alpha$, wherein the plane of symmetry simultaneously is an electro-optical plane. The deflection field generated by the deflecting element deflects the charged particles by an angle $\pi - \alpha/2$, leading to a total deflection angle of $2\pi$ and co-linearity of the inlet axis and outlet axis.

10 Claims, 6 Drawing Sheets

IMAGING ENERGY FILTER FOR ELECTRONS AND OTHER ELECTRICALLY CHARGED PARTICLES AND METHOD FOR ENERGY FILTRATION OF THE ELECTRONS AND OTHER ELECTRICALLY CHARGED PARTICLES WITH THE IMAGING ENERGY FILTER IN ELECTRO-OPTICAL DEVICES

BACKGROUND OF THE INVENTION

The present invention relates to an imaging energy filter for electrons and other charged particles which filters an object formed by these particles at the filter inlet by means of an energetic selection of charged particles in the region of the dispersion aperture, due to the retransfer of the particles to original object locations which these particles have left, without loss of information about their positions.

The electro-optical effect of the additional element, which generates a field deflecting the charged particles by an angle of $\pi-\alpha/2$, causes also the angle of the axes at the energy filter inlet and outlet relative to the primary axis to remain the same, and in consequence, the inlet and outlet axes are collinear.

The use of this element leads to a total deflection angle of $2\pi$.

The invention relates also to possible uses of this imaging energy filter.

Imaging energy filters have a short history and have a relatively unassuming bibliography compared with methods of signal filters, for example retarding fields (the so-called "retarding field analyzer") or with the classical electron spectroscopy, which is reflected in the work of H. Ibach, "Electron Spectroscopy for Surface Analysis" (Springer Publishing, 1977, Berlin).

In the first case, imaging with particles whose energies lie above a value determined with a grid potential (for example in low energy electron diffraction) is only possible incompletely, as the properties of the energy filters, which are used in laterally integrated electron spectroscopy measurement, do not permit direct adaptation for the benefit of two-dimensional image formation.

The first developments in spectroscopic imaging technology, which is based on the use of magnetic fields, are connected with electron transmission microscopy. Here, there are many innovative solutions, which have lead to mono-energetic images. The use of electrostatic filters in this case is made difficult because of the high energies of the electrons.

First, the dynamic development of emission and reflection electron microscopy (for example PEEM, LEEM) moved many new activities from the field of imaging energy filtration.

The combination of image formation and filtration technology, which is designated as spectromicroscopy, is desired here in particular, since in emission microscopy, as with the classical, optical microscopy, all object points are mapped in real time. In order to achieve a chemical contrast in this case also in real time, that is, the lateral distribution of different elements (assuming that the energy of the illumination of the probe is sufficient), one should select with the aid of the imaging energy filter a line that is characteristic for the specific element from the electron spectrum and minimizing the image-formation errors, visualize the probe with electrons originating from this narrow region of the energy spectrum.

The aspects connected with this topic are discussed in the work "The development of electron spectromicroscopy", B. P. Tonner, et al, J. Electron Spectrosc. Relat. Phenom., 75 (1995) 309.

The plurality of such devices, which were discovered and made with the object of achieving a chemical contrast, uses the advantage of the hemispheric (180°) energy filter or its segments. This type of energy filter was first described by E. M. Purcell in Phys. Rev. 54 (1938) 8. Indeed, the image-formation properties as well as this filter were described, among other things, first in the work of B. Wannberg'a, G. Endahl'a I A. Skoellermo: "Imaging properties of electrostatic energy analyzers with toroidal fields", J. Electron Spectr. Rel. Phenomen. 9 (1976), 111.

A special case of the filter mentioned in this article is the energy filter with cylindrical electrodes, which act on the charged particles only in one plane, which requires to the use of an additional electro-optical elements, which act only in the plane that is vertical to the first.

The new solution, which broadens the function of the imaging hemispherical filter, was proposed in U.S. Pat. No. 5,185,524. In the inner hemisphere, screened openings were made, through which electrons in the area of the retarding field penetrate and thereby improve the resolution of the system. The disadvantage of this invention is the reduction of the transmission as well as the increase of the electron underground from the secondary emission.

The combination of two filters, which are fragments of the spheres, was used in a spectromicroscope, which is described in U.S. Pat. No. 6,667,477 B2. Because of a symmetrical lens, which transmits the image from one filter to others, one obtains a reduction of the imaging error at the outlet of the entire system.

Since the charged particles in this system first are deflected at an angle $\alpha$ and then at an angle $-\alpha$, the co-linearity of the axes on the system inlet and outlet is not fulfilled.

The imaging energy filter described in DE 69027602 T2 comprises four hemispherical energy filters, which are arranged in the shape of the $\Omega$, such that the total angle amounts to $4\pi$.

Although the particles going into and out of the energy filter move along the same axis, the system is complicated and has a compact structure, which makes difficult its construction and use. Nevertheless, the minimizing of imaging error is an advantage.

A similar solution is used in DE 19633496 A1.

The co-linearity of the inlet and outlet axes of the imaging energy filter and the total deflection angle of $3\pi$ was achieved also with the idea in DE 69705227 T2. The deflection of the particles takes place in two inclined planes: in one, twice at an angle $\pi/2$, and in the other, at $2\pi$.

A similar solution, in which the combination of magnetic fields was used, can be found in DE 695 29987 T2. In this instrument, some variations of the deflection of particles are possible, which leads to the total deflection at $2\pi$ and the overlapping of the inlet and outlet axes.

One of the possibilities is the double deflection of the particles in a first sector of the magnetic field at an angle of $\pi/2$ and the single deflection at an angle of $\pi$ in a second sector of the magnetic field.

In all of these variations of the system, the deflection takes place in a plane that is common to all of the elements.

SUMMARY OF THE INVENTION

The goal of the present invention is the production of an imaging energy filter of charged particles, which is constructed compactly from the least possible electro-optical elements and does not impair the lateral resolution, which because of the intensity of the chemical contrast, and which leads to an "elemental mapping" of the observed surface.

The subject matter of the invention is an imaging energy filter for electrons and other charged particles, whose total deflection angle amounts to $2\pi$, which contains two concentric and spherical electrodes with radii of R1 and R2 and which generates an electrostatic field deflecting the particles by an angle of $\alpha:2\pi>\alpha>\pi$, and which reflects at the outlet the distribution of the particles at the inlet.

In the preferred manner, a circle with the radius $R0=(R1+R2)/2$ is selected as the central trajectory for the electrons and other charged articles with the so-called "pass energy".

The energy filter is characterized in that in the intersection point of the outlet axis with the inlet axis and in the symmetry plane of the angle $\alpha$, which simultaneously is an electro-optical image plane, a deflecting element generating an electrostatic, magnetic, or combination deflection field is mounted, which is common for the particles moving in and out. The outlet axis is a tangent to a central trajectory along which the particles move at the outlet from the region of the concentric electrodes, and the inlet axis is a tangent to the central circular trajectory, along which particles at the inlet move to the region of the concentric electrodes. The distance between the deflecting element and the center of the spherical and concentric electrodes amounts to $Ro/\cos(\pi-\alpha/2)$.

This field deflects the charged particles, which move in the direction of this element from the source along the axis, which runs through the intersection point of the inlet and outlet axes of the concentric electrodes and which is perpendicular to the symmetry plane of the angle $\alpha$. The particles form an image in this plane, which simultaneously is an object of the filtration and are deflected by an angle of $\pi-\alpha/2$, so that these particles move further along the inlet axis to the region of the concentric electrodes, and after deflection at an angle $\alpha$, turn back along the outlet axis from the region of the concentric electrodes to the same deflection-field generating deflecting element and provide an energetically filtered image at the point of the original object in the symmetry plane. The deflection field generated by the deflecting element deflects the charged particles again by an angle $\pi-\alpha/2$, which leads to a total deflection angle $2\pi$ in the imaging energy filter and thereby to co-linearity of the inlet and outlet axes of the imaging filter.

In order to achieve a high energy resolution of the described system, the imaging energy filter includes a dispersion aperture at the point of the central trajectory, which defines the energy region, has the potential of the central trajectory, and on both sides is screened with the electrodes simulating the field of the concentric and spherical electrodes.

The dispersion aperture, which is located in the image plane, also simultaneously defines the size of the image. When the dispersion aperture is located in one of the planes of the angular distribution, it determines the opening angles, and thereby, the brightness of the image on the energy filter outlet.

The deflecting element, which is arranged in the intersecting point of the outlet axis, which is a tangent to the central trajectory, along which particles at the outlet move from the region of the concentric electrodes, with the inlet axis, which is a tangent to the central trajectory, along which particles at the inlet move to the region of the concentric electrodes, and in the symmetry plane of the angle $\alpha$, which simultaneously is an electro-optical image plane, produces an electrostatic, magnetic or combined deflection field.

The subject matter of the present invention is to provide in the further embodiments an imaging energy filter for electrons and other charged particles, which contains two concentric and spherical electrodes, which produce an electrostatic field, which deflects the particles by an angle $\alpha:\pi<\alpha<2\pi$. The filter is characterized in that in the symmetry plane of the angle $\alpha$ (which simultaneously is an electro-optical image plane), or in the first plane of the angular distribution, or in the second plane of the angular distribution, at the point of the central trajectory, a dispersion aperture defining the energy range is located, which is screened on both sides with electrodes simulating the field of the concentric and spherical electrodes. The dispersion aperture has preferably the potential of the central trajectory. In the outer spherical electrode, a bore is provided on the extension of the inlet axis, which makes possible the drift of the charged particles when the concentric and spherical electrodes have the potential of the axis and, therefore, cannot provide a deflection field.

In order to make possible the local spectroscopic measurement or the image formation of the energetically filtered angular distribution, a bore is provided in the outer spherical electrode behind the dispersion aperture, on the extension of the axis perpendicular to the dispersion aperture and tangential to the central trajectory, by means of which the charged particles drift to the detection system when the concentric and spherical electrodes behind the dispersion aperture have the same potential as the central trajectory.

The object of the present invention also is to provide a method for the imaging energy filtration of the electrons and other electrically charged particles in electron microscopes and similar electro-optical devices with the use of the imaging energy filter. In electron microscopes, with the visualization of the probe, reflected or emitted electrons with a generally wide energy spectrum that is characteristic for the probe are used.

The chromatic aberrations of the imaging system without the imaging energy filter cause a significant impairment of the lateral resolution and the quality of the image.

The use of the method of the imaging energy filtration for electrons and other charged particles leads to a selective choice of the energies from narrow ranges. The selection of energy is determined by the characteristic electronic transitions. By means of the admission of only these selected electrons or other charged particles, one obtains with the image formation selective, two-dimensional information about the lateral distribution of these transitions.

The object of the present invention also is a method of the imaging energy filtration of electrons and other electrically charged particles in monochromators and in similar electro-optical devices with the use of the imaging energy filter.

As the object of the energy filtration, an emitter of the electrons or other electrically charged particles, its image or intermediate image, or also its angular distribution or intermediate image of the angular distribution is used, leads to a monochromatizing and, thereby to an improvement of the quality of the beam in the electro-optical system.

The object of the present invention also is to provide a method for imaging energy filtration of the electrons and other electrically charged particles in measurement devices with high time resolution.

DESCRIPTION OF SPECIFIC EMBODIMENTS

Figure 1:
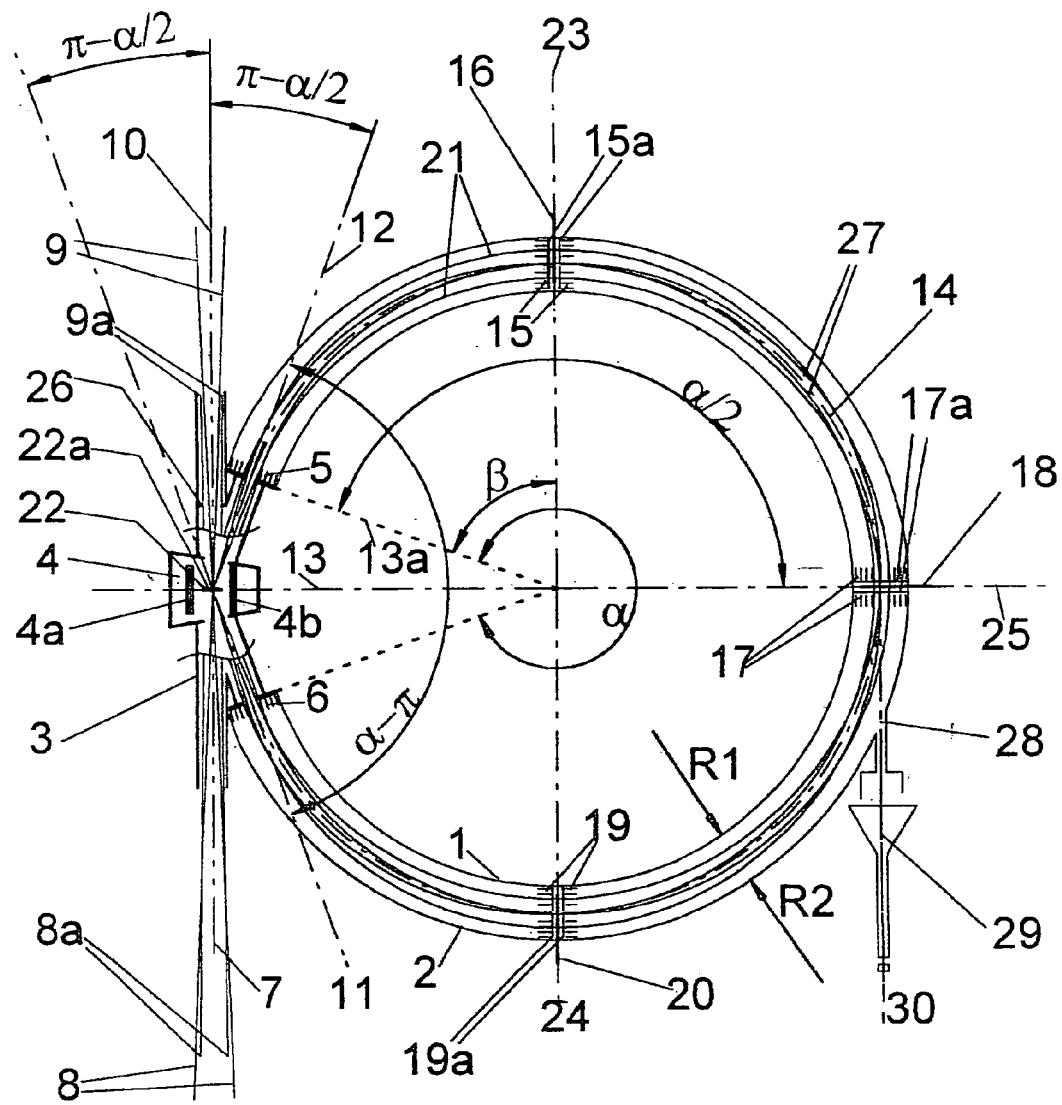
FIG. 1 is a schematic illustration of the imaging energy filter with a total deflection angle of $2\pi$ and an electrostatic deflecting element.

The invention represents an imaging energy filter for electrons and other electrically charged particles and a method for energy filtration.

This function is fulfilled in the form of the imaging energy filter of the charged particles, such as electrons and ions (FIG. 1), whose total deflection angle amounts to $2\pi$. The imaging energy filter contains two concentric and spherical electrodes 1 and 2 with radii of R1 and R2 and generates an electrostatic field that deflects the particles at an angle $\alpha$: $2\pi > \alpha > \pi$, which reflects the distribution of the electrically charged particles at the inlet at the outlet.

The energy filter is characterized in that at the intersecting point of the outlet axis 11 with the inlet axis 12 and in the symmetry plane 13 of the angle $\alpha$, which simultaneously is an electro-optical image plane 25, a deflecting element 4, 31 which generates an electrostatic or magnetic or combined deflection field is mounted that is common for the ingoing and outgoing particles 8, 8a, 9, 9a. The outlet axis 11 is a tangent to the central trajectory 14, along which the particles at the outlet move from the region of the concentric electrodes 1 and 2, and the inlet axis 12 is a tangent to the central trajectory 14, along which the particles at the inlet move to the region of the concentric electrodes. The distance between the deflecting element and center of the spherical and concentric electrodes 1 and 2 amounts to $Ro/\cos(\pi-\alpha/2)$, where $Ro = (R1+R2)/2$.

This field deflects the charged particles 8, 8a, which move in the direction of this element 4, 31 from the source along the axis 7, which runs through the intersecting point of the inlet 12 and the outlet axis 11 in the region of the concentric electrodes 1 and 2, and which is perpendicular to the symmetry plane of the angle $\alpha$, and which, in this plane, provide an image 22, which simultaneously is an object of the energy filtering by an angle $\pi - \alpha/2$, so that these particles move further along the inlet axis 12 to the region of the concentric electrodes 1 and 2. After deflection by an angle $\alpha$, the particles turn back along the outlet axis 11 from the region of the concentric electrodes 1 and 2 to the same deflecting element 4, 31 that generates a deflection field and in it, an energetically filtered image 22a is provided at the location of the original object 22 in the plane 13. The deflection field generated by the deflecting element 4, 31 deflects the charged particles again by an angle $\pi - \alpha/2$, which leads to a total deflection angle $2\pi$ in the imaging energy filter and, thereby, to the co-linearity of the inlet 7 and the outlet axes 10 of the imaging energy filter.

In order to achieve a high energy resolution of the described system, a dispersion aperture is required in at least one of the three planes 23, 24, 25. In the event the dispersion aperture is absent at these locations, the energy resolution of the system is defined by the distance between the concentric and spherical electrodes 1, 2.

Depending on the geometry of the imaging energy filter, the dispersion aperture, which in the preferred manner has the potential of the central trajectory 14, in these three cases, is mounted within the field generated by the two concentric electrodes, which requires its precise simulation with additional electrodes on both sides of the dispersion aperture.

This offers simultaneously the possibility of an electric insulation of the fragments of the concentric and spherical electrodes 1, 2 at these locations and a commutation of the energy filter potentials and, thereby, the localized measuring of the electronic spectrum, or imaging the angular distribution in the plane 23 (in this case, a lens system is required behind the dispersion aperture 18). On the extension of the axis perpendicular to the dispersion aperture and tangential to the central trajectory, an opening is located, which makes possible drift of the charged particles to the detector system when the fragments of the electrodes 1, 2 behind the dispersion aperture have the same potential (in the preferred manner, the potential of the central trajectory).

An example of this situation is shown in FIG. 1 (28, 29, 30).

The most optimal solution which ensures the freedom of choice during the experiment is the provision of a dispersion aperture in the image plane 25, as also in the plane of the image of the angle distribution 23, 24.

In the first case of plane 25, the dispersion aperture does not define the angle which ensures the brightness of the image 22a, but simultaneously determines its size and blurring or smearing of the energy, so that the production of the image is not possible with high energy resolution with lower magnifications.

In the second case (dispersion aperture in the plane 23 or 24), a maximum size of the image permitted by the system can be achieved with the desired resolution determined by the size of the dispersion aperture; however, the production of bright images with high energy resolution is not possible based on the simultaneous reduction of the opening angle by the dispersion aperture.

The latter problem appears to be less critical when the imaging energy filter is used in electron microscopy.

A high magnification of the microscope objective (M=50÷100) causes the opening angle in the image plane 13 on the energy filter inlet to be small, similar to the width of the beam in the plane 23 or 24, so that the dispersion aperture mounted in one of these planes, which is greater than the critical size reduces the energy blurring without an affect on the angle and image size.

The situation is reversed when the electro-optical lens (or a lens system), which is localized between the objective and the energy filter, transmits the image existing in the focal plane of the objective to the plane 13 at the inlet of the energy filter.

The dispersion aperture 18 of the plane 25 assumes the function of the aperture 16 or 20 in the planes 23 or 24 and vice versa. This combination is favorable when the information from the narrow energy range about the angular distribution of the charged particles emitted or reflected by the probe is desired.

The use of the dispersion aperture in one of the planes 23 or 24 permits a selective localized measurement of such angular distributions.

The charged particles in the imaging energy filter are subject to an energetic separation in the region of the deflecting element 4, 31.

Figure 2:
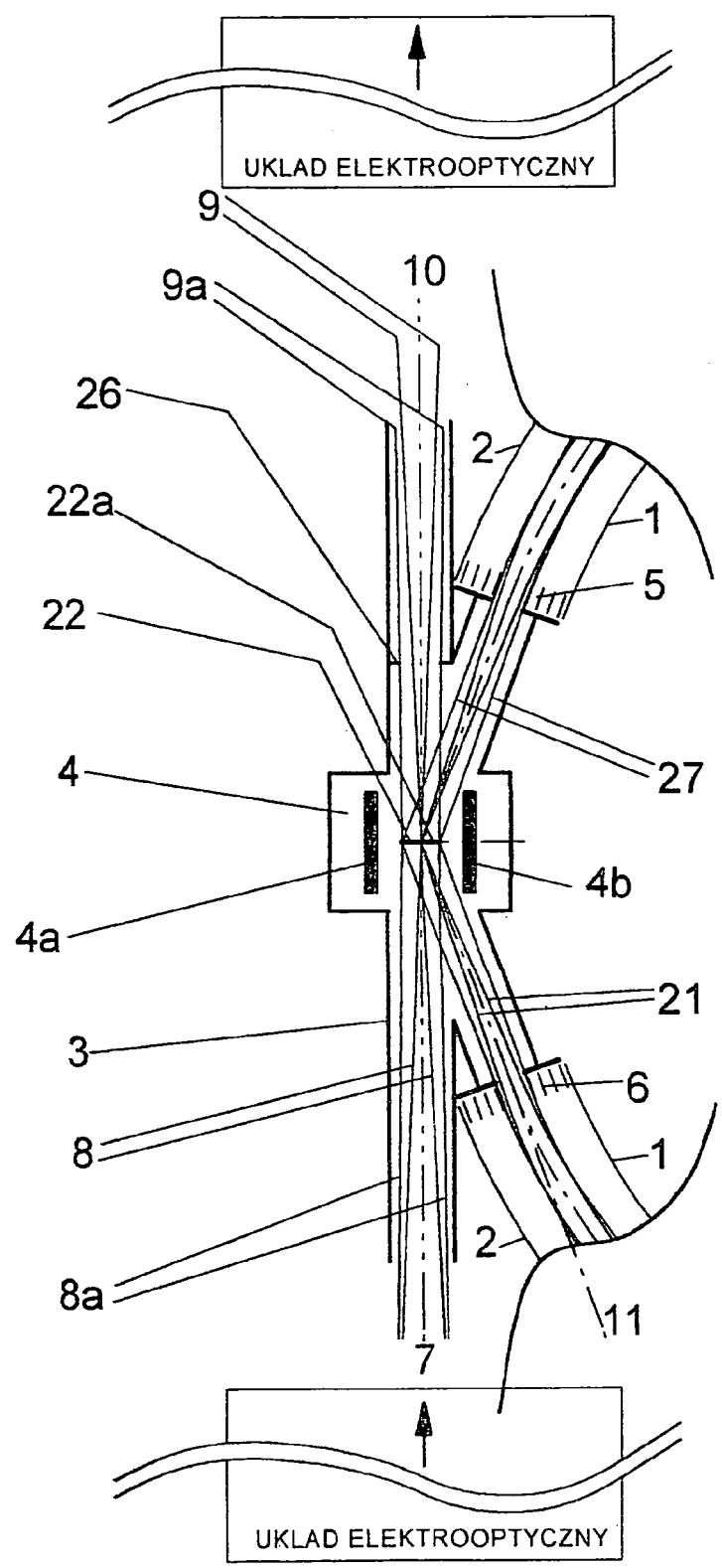
FIG. 2 is a schematic representation of the trajectories $\alpha$: 8, 9, 21, and $\gamma$: 8a, 9a, 27 of the charged particles in the region of the deflection field with possible localizing of the electro-optical system.
Figure 3:
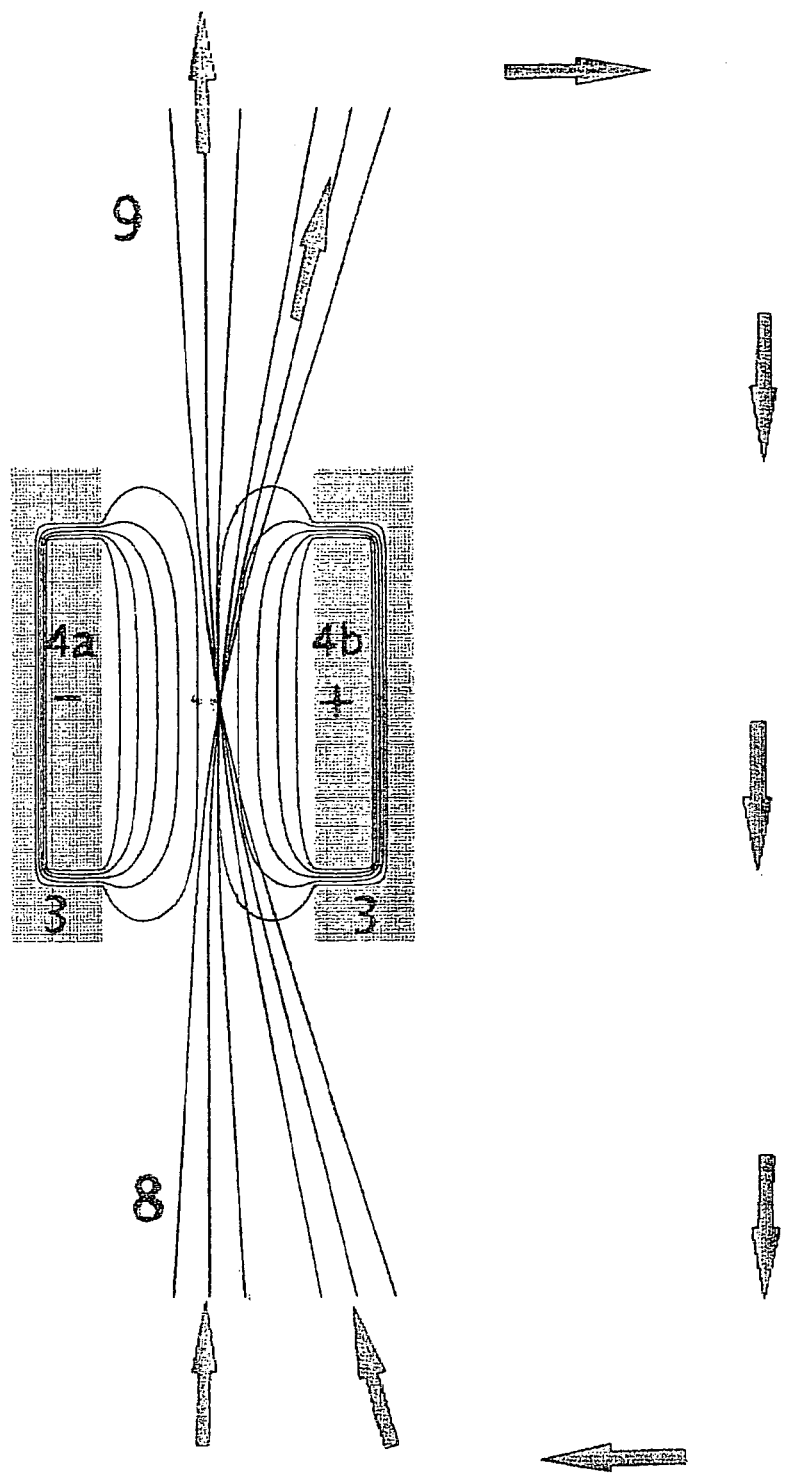
FIG. 3 shows a two-fold deflection of the charged particles; trajectories and potential distribution are calculated for a real, electrostatic deflection system with flat deflection electrodes.

The deflection electrodes of the deflecting element in FIG. 1, 2, or 3 take the form of a flat, rectangular plate in the simplest case with one side (which lies in the plane of the drawing) substantially shorter than the other side (which ensures the fulfillment of the condition of one-dimensionality of the deflection field).

Likewise, on the same basis, the opening in the electrostatic screen 3 should take the form of long "slots". In this manner, the "single-plane" quality of the deflection of the charged particles is guaranteed.

After the deflection by an angle of $\pi-\alpha/2$ in the deflecting element 4, 31, the charged particles move with the "correct" energies further along the axis 12 until entering the concentric and spherical electrodes 1, 2. In the system, charged particles with higher as well as lower energies are found.

Those with the lower energy do not represent a problem, since they are deflected in the deflecting element 4, 31 more strongly from the main axis in the direction of the screen 3 and are neutralized there. The charged particles with higher energies pose a problem, however, because they are more weakly deflected and move into the detection region as a false signal, going around the energy filter.

In order to avoid this effect, at the outlet of the imaging energy filter, an aperture 26 is mounted, which blocks and neutralizes the charged particles.

The charged particles 8, 8a with a "correct" energy, which is determined by the electrical voltage between the deflection electrodes 4a, 4b, 1, 2 and/or the potential of the probe, pass through the region of the concentric electrodes 1 and 2 and again enter the region of the deflection element 4, 31. In this manner, the charged particles 9, 9a turn back on the axis 10, which they previously have left. Since their spatial divergence is minimal, the aperture 26 does not form an obstacle on the path to the detector.

FIG. 2 represents schematically the trajectories $\alpha$: 8, 9, 21 and $\gamma$: 8a, 9a 27 of the charged particles, which provided in the plane 13 a real or a diffraction image (angular distribution), which simultaneously is used as the object of the energy filtration 22 by the energy filter.

Due to locating an electron optical system in front of the imaging energy filter, the selection and the transfer to the plane 13 of one of these two images as the object 22 for the energy filter is possible. In addition, this type of electro-optical system (in the case of the real image as the object 22) permits the localization of the image of the angular distribution (to which the charged particles 8a, 27 with trajectories $\gamma$ contribute) in the plane 23, which forms with the plane 13a (an inlet to the region of the concentric electrodes 1 and 2) an angle $\beta=\alpha/2-\pi/2$.

And conversely, this type of electro-optical system (in the case of the angular distribution as the object 22) permits the localization of the real image in the plane 23, which forms with the plane 13a (an inlet to the region of the concentric electrodes 1, 2) an angle $\beta=\alpha/2-\pi/2$.

The electro-optical system is necessary in order to fulfill the symmetry conditions for the energy filter and, thereby, to reach the optimal working point, which leads to the complete minimizing of the imaging error of the energy filter in the plane 13.

In the plane 13, then, a real, achromatic image 22a of the probe exists, which is provided by the charged particles with the energy determined by the size of the dispersion aperture 16, 18, 20 and potential of the system. The same symmetry conditions must be fulfilled when the electro-optical lens (or a lens system) which is located between the objective and the energy filter transmits the image of the angular distribution, which exists in the optical plane of the objective into the plane 13 on the energy filter inlet.

A real image of the probe must exist in this case in the plane 23, which forms an angle $\beta=\alpha/2-\pi/2$ with the plane 13a at the inlet to the region of the concentric electrodes 1, 2.

Such a method is necessary in order to ensure symmetry in the energy filter and thereby, to achieve complete minimizing of the imaging error in the plane 13, which now contains a diffraction plane.

In the plane 13, then, an achromatic image of the angular distribution 22a of the probe exists, which is provided by the charged particles with the energy determined by the size of the dispersion aperture 16, 18, 20 and potential of the system, whereby the size of the visualized region is defined by the aperture 16 or 20.

An electro-optical system, which is located behind the energy filter, makes possible the magnification of the image 22a, which exists in the symmetry plane 13 on the energy filter outlet.

FIG. 3 represents an example of a field-generating deflecting element which deflects the charged particles from the axis 7 to the axis 12 at the inlet to the concentric electrodes 1, 2 and from the axis 11 at the outlet of the concentric electrodes 1, 2 to the axis 10.

The symmetry of the total system, with reference to the plane 13, leads to the desired property of the unchangeability of the angle, which is reflected in the overlapping the inlet 7 and the outlet axis 10 of the energy filter.

In an ideal representation (FIG. 2), the deflection field disappears outside of the plane 13 and does not establish thereby an additional angle- or location dependent aberration. In reality, however, as shown in the example of a deflecting element in FIG. 3, the scope of the deflection field expands to the space defined by the size of the deflecting electrodes 4a, 4b. As a result, the charged particles in the area of the deflecting element 4 move along a parabola, which diverges from the center of the field.

By means of the extrapolation of the linear part of the trajectory (in a field-free region after leaving the deflecting element 4 up to the plane 13 in the interior of the deflecting element), one determines a virtual point, which location (because of the aberrations of the deflecting element 4, 31) is burdened with imaging errors.

Because of the mirror symmetry (relative to the symmetry plane 13) of the system with a total deflection angle of $2\pi$, which comprises the concentric and spherical electrodes 1,

2 (deflection angle $\alpha$: $\pi<\alpha<2\pi$) and a deflecting element 4, 31 (deflecting angle $\beta=\pi-\alpha/2$), the imaging error on the energy filter outlet changes the algebraic sign, which leads to a compensation of the imaging error in the symmetry plane 13 in which the achromatic image 22a exists at the outlet of the energy filter.

The described symmetry of the system implies the equality of the flight times, which makes possible the use of the imaging filter with high time resolution in the measuring systems.

Figure 4:
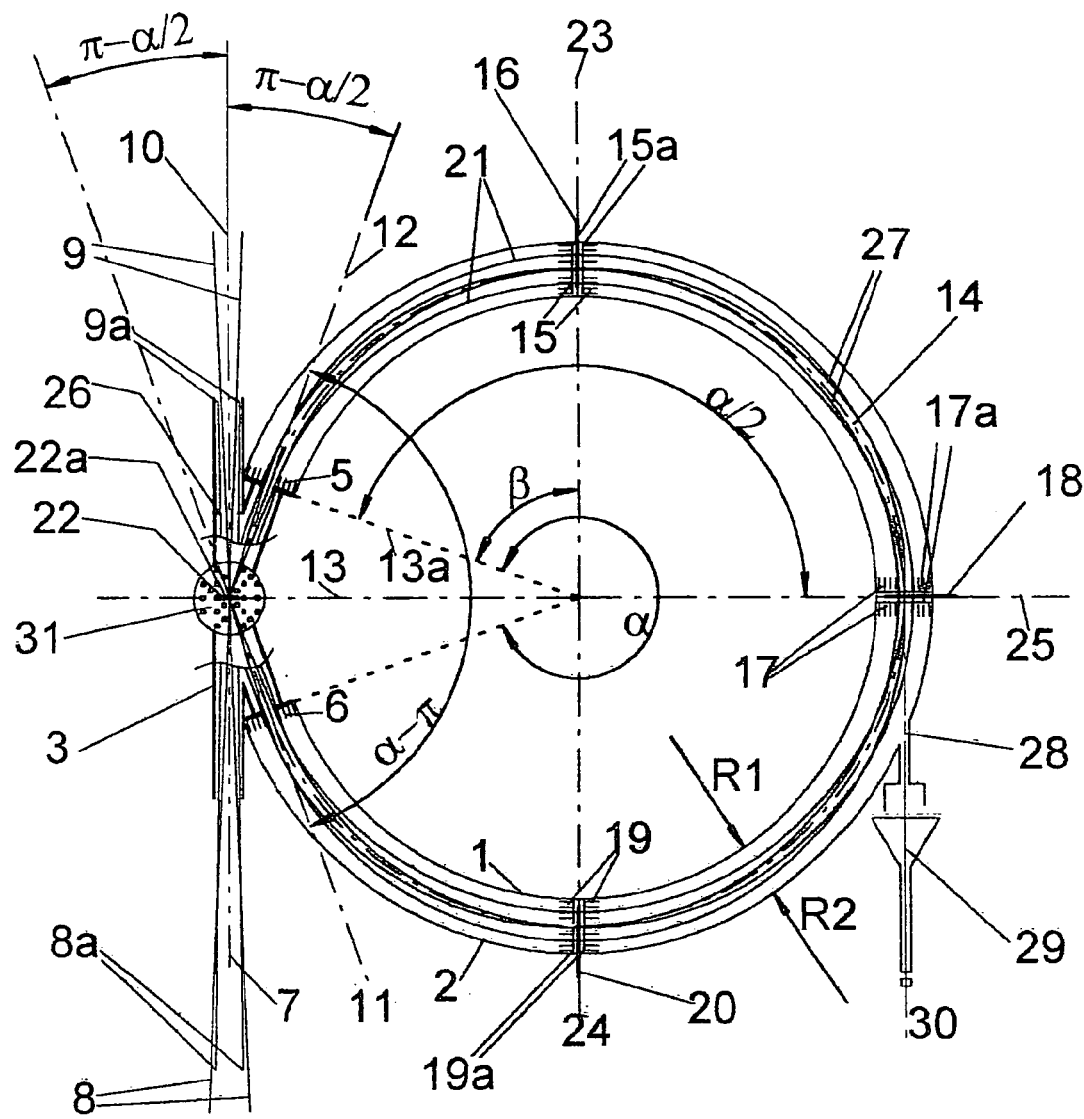
FIG. 4 is a schematic representation of the imaging energy filter with a total deflection angle of $2\pi$ and a magnetic deflecting element.

FIG. 4 shows an imaging energy filter, which is characterized in that in the intersection point of the outlet axis 11 with the inlet axis 12, a deflection element 4, 31 that generates a magnetic deflection field is mounted. The outlet axis 11 is a tangent to the central trajectory 14, along which the charged particles at the outlet move from the region of the concentric electrodes 1, 2, and the inlet axis 12 is a tangent to the central trajectory 14, along which the charged particles on the inlet move to the region of the concentric electrodes. The deflection element 4, 31 also is disposed in the symmetry plane 13 of the angle $\alpha$, which serves simultaneously as an electro-optical plane 25, and serves commonly for the ingoing and outgoing particles 8, 8a, 9, 9a.

This field deflects the charged particles 8, 8a, which move in the direction of this element 31 from the source along the axis 7, which runs through the intersection point of the inlet 12 and the outlet axis 11 in the region of the concentric electrodes 1, 2 and which is perpendicular to the symmetry plane 13 of the angle $\alpha$. The particles form an image 22a in this plane, which simultaneously is an object 22 of the energy filtering, and are deflected by an angle $\pi-\alpha/2$, so that these particles move further along the inlet axis 12 to the region of the concentric electrodes 1, 2 and after deflection by an angle $\alpha$, turn back along the outlet axis 11 from the region of the concentric electrodes 1, 2 to the same element 31 that generates a deflection field, and in it, provides an energetically filtered image 22a at the location of the original object 22 in the plane 13. The magnetic deflection field generated by the element 31 deflects charged particles by an angle $\pi-\alpha/2$, which leads to a total deflection angle $2\pi$ in the imaging energy filter and, thereby, to co-linearity of the inlet 7 and the outlet axes 10 of the imaging energy filter.

Advantageously, in the case of the magnetic deflection, the possibility exists of placing the deflecting element outside of the vacuum system. The disadvantage, however, depends on the properties of the magnetic field: the solution of the equation of motion is not invariable upon changing the algebraic sign of the movement.

Therefore, the imaging error in the case of the magnetic deflection shows an additive character: the imaging error in the plane 13 at the inlet is added with the imaging error at the outlet, which is different from the case of the electrostatic field.

The problem of the compensation of the imaging error plays a small role here, since the quality of the virtual image in the center of the magnetic field 31 is higher than in the electrostatic deflection field 4, which permits this method also in the end effect.

Figure 5:
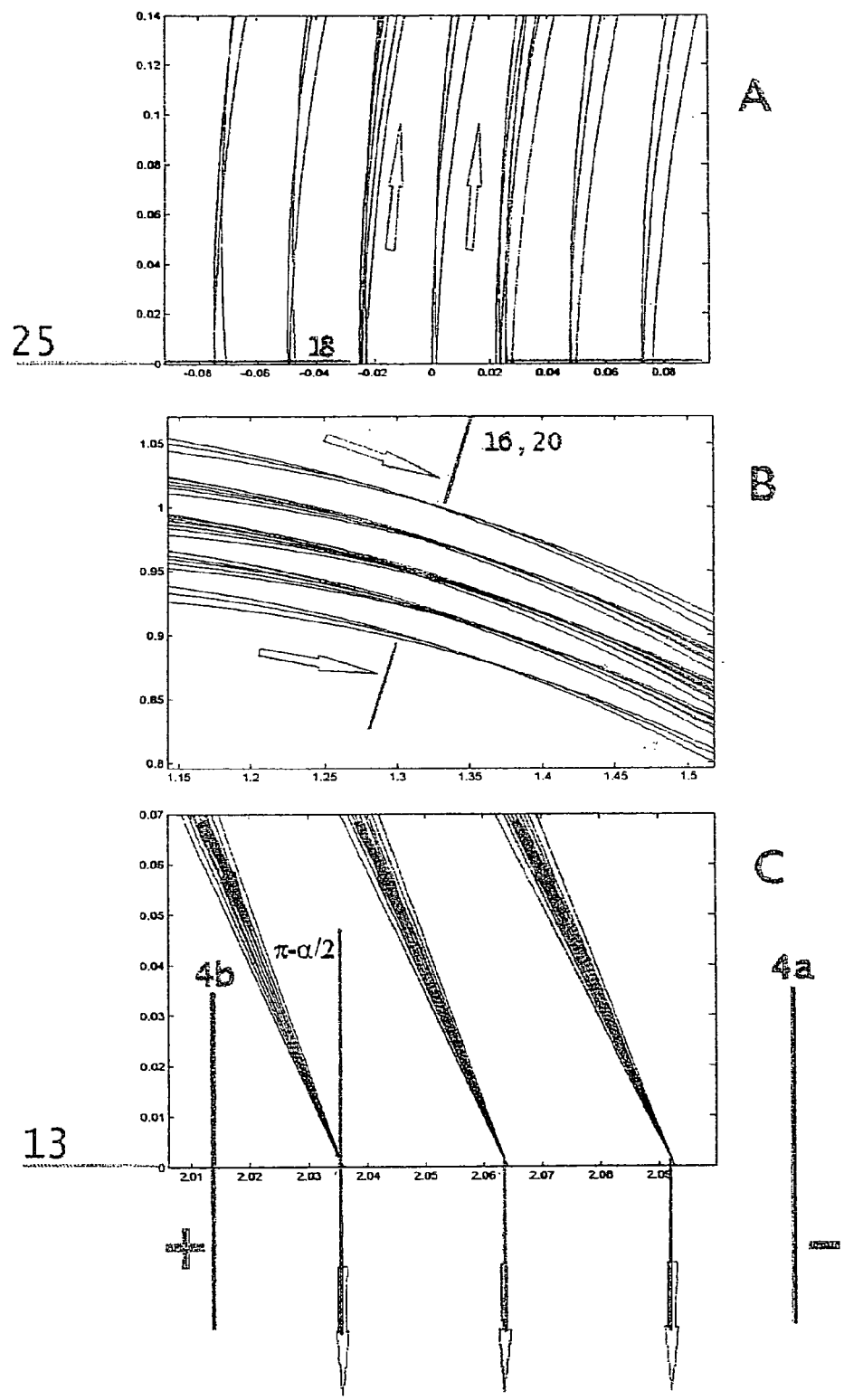
FIG. 5 shows trajectory fragments of the charged particles with starting angles $-1.5°, 0°, 1.5°$ and energies $\Delta E/E$:$-0.025, 0.0, 0.025$, which represent three object points distanced from one another at $\alpha x/r_0 = 0.028$.
  A) Trajectories of the charged particles after the dispersion aperture 18;
  B) Trajectories of the charged particles at the dispersion aperture 20, which is localized in the plane 23 of the angular distribution of the object 22, an electro-optical, analogous situation to localizing the dispersion aperture 16 in the plane 23 of the angular distribution of the object 22;
  C) Trajectories of the charged particles after leaving the region of the concentric and spherical electrodes 1 and 2, which provide the three image points in the symmetry plane 13.

In FIG. 5, an accurate, analytical solution of the equation of motion in the electrostatic central field for specific boundary conditions in the imaging energy filter is illustrated at three selected locations, with the assumption that the potential distribution on the edges 5, 6 of the spherical and concentric electrodes 1, 2 is ideal, the field-free region has a potential of the central trajectory 14 with $r_0=1$, and the deflection angle of the spherical and concentric electrodes 1, 2 amounts to $22/12\pi$.

It was also assumed that the object 22 from which the charged particles start with the selected energies $\Delta E/E$: $-0.025, 0.0, 0.025$ and angles: $-1.5°, 0°, .1.5°$, is represented in the plane 13 with three points ($\Delta X=0.028$).

FIG. 5A represents the fragments of the trajectories of the charged particles in the plane 25 favorable for the energy analysis, in which the quality of the image is low because of the spherical and chromatic aberrations. In the figure, also the dispersion aperture 18 is shown, in order to illustrate the effect of the reduction of the size of the image with the increasing energy resolution.

FIG. 5B shows an alternative method of the energy filtration. The dispersion aperture 16 in this case is located in the plane 23 of the angle distribution of the object 22; it is an electro-optical situation analogous to locating the dispersion aperture 20 in the plane 24 of the angular distribution of the object 22.

In both of this case, the dispersion aperture shows no effect on the size of the image; it can, however, limit the opening angle and therefore the brightness of the image.

FIG. 5C illustrates the effect of the compensation of the chromatic and spherical imaging error in the plane 13; the charged particles are focused perfectly after the energy selection in one of the planes 23, 24, or 25 independently of the energy and angle to the three points, which provide an achromatic image. FIG. 5C also explains schematically the deflection in the direction of the primary axis 10 by an angle $\pi-\alpha/2$.

In imaging technology, it is often desired that the measuring instrument simultaneously includes the energetically filtered real image and an energetically filtered image of the angle distribution. In this case, with regard to two electro-optical systems shown schematically in FIG. 2, an additional lens system is required behind the dispersion aperture 18 and bore 28.

In imaging technology, it is also often desired that the measuring instrument offers the possibility of detecting two images: the image (real or image of the angular distribution), which is energetically, selectively filtered and the image (real or image of the angle distribution), which is provided from all of the particles.

This goal is achieved when the inlet axis 7 of the energy filter does not overlap its outlet axis 11; in this type of configuration, the requirement of using an electrostatic or magnetic deflection element does not exist. As a result, the inlet axis 7 and the outlet axis 11 are inclined with an angle $2\pi-\alpha$, which makes possible equipping the microscope with two independent lens systems.

Figure 6:
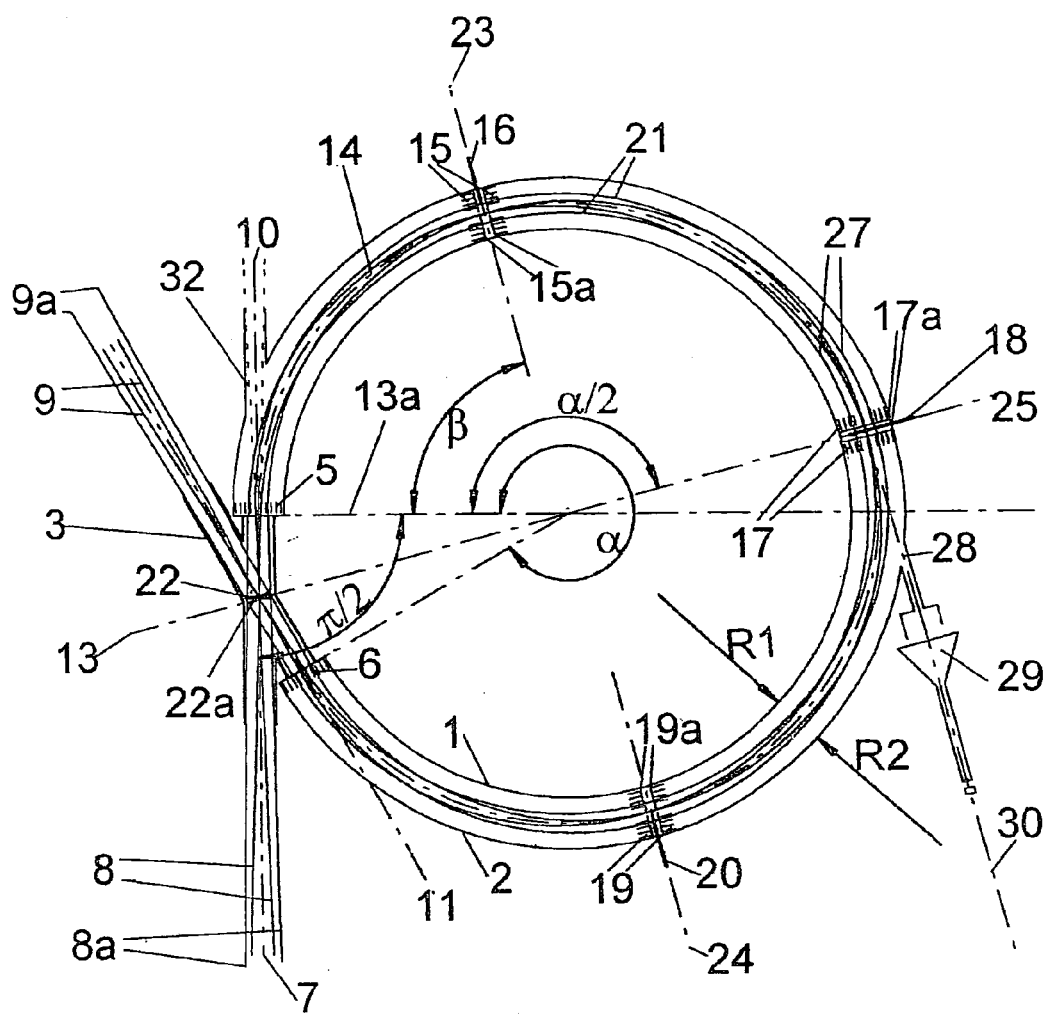
FIG. 6 is a schematic representation of the imaging energy filter with a total deflection angle of $\pi < \alpha < 2\pi$ with which the inlet and outlet axes are inclined at an angle of $2\pi - \alpha$.

FIG. 6 represents an imaging energy filter of the charged particles, such as electrons and ions, which has two concentric and spherical electrodes 1 and 2 with radii of R1 and R2, which produce an electrostatic field that deflects the particles by an angle $\alpha$:$\pi<\alpha<2\pi$. In the outer electrode 2, on the extension of the inlet axis 10, a bore 32 is provided, which makes possible the drift of the charged particles when the concentric and spherical electrodes 1, 2 has in the preferred manner the potential of the axis 7 and therefore do not produce a deflection field.

The image-forming energy filter of the charged particles in FIG. 6 also is characterized in that a dispersion aperture which defines an energy range is provided in the symmetry plane 13 of the angle $\alpha$, which simultaneously is an electro-optical image plane 25, in the region which is distanced from at an angle $\alpha/2$ from the inlet 13a to the concentric and spherical electrodes 1, 2 and at the location of the central trajectory 14. The dispersion aperture is screened on both of its sides with electrodes 17 simulating the field of the concentric and spherical electrodes 1, 2 and has preferably the potential of the central trajectory 14.

The most optimal solution, which ensures the freedom of choice during the experiment, is the provision of a dispersion aperture in the image plane 25 as well as in the plane of the image of the angle distribution 23, 24.

In the first case of the plane 25, the dispersion aperture does not define the opening angle, which ensures the brightness of the image 22a, but simultaneously determines its size and blurring of the energy, so that the production of the images is not possible with high energy resolution with low magnifications.

In the second case (dispersion aperture in the plane 23 or 24), a maximum size of the image allowed by the system can be achieved with any resolution determined by the size of the dispersion aperture. However, the production of bright images is not possible with high energy resolution because of the simultaneous reduction of the opening angle by the dispersion aperture.

Depending on the geometry of the image-forming energy filter, the dispersion aperture 16, 18, 20, which in the preferred manner has the potential of the central trajectory 14, is mounted in these three cases (plane 23, 24 or 25) within the field generated by the two concentric electrodes, which requires its precise simulation on both sides of the dispersion aperture by the electrodes 15, 17, 19.

This offers simultaneously the possibility of an electric insulation of the fragments of the concentric and spherical electrodes 1, 2 at these locations and a commutation of the energy filter potential and, thereby, the localized measuring of the electronic spectrum, or imaging the angular distribution in the plane 23 (in this case, a lens system is required behind the dispersion aperture 18). On the extension of the axis perpendicular to the dispersion aperture and tangential to the central trajectory, an opening is located, which makes possible a drift of the charged particles to the detector system when the fragments of the electrodes 1, 2 behind the dispersion aperture have the same potential.

The example of this possibility of local spectroscopic measurement is illustrated in FIG. 6 (28, 29, and 30).

Because of the localizing of an electro-optical system in front of the imaging energy filter, the selection and transfer to plane 13 of one of these two images as an energy filter object 22 for the energy filtering is made possible. In addition, this type of electro-optical system, in the case of the real image as the object 22, permits the localizing of the image of the angular distribution (to which the charged particles 8a, 27 with trajectories γ contribute) into the plane 23, which forms with the plane 13a at the inlet to the region of the concentric electrodes 1 and 2 an angle $\beta=\alpha/2-\pi/2$.

The electro-optical system is necessary in order to fulfill the symmetry conditions for the energy filter and, thereby, to reach the optimal working point, which leads to the complete minimizing of imaging error of the energy filter in the plane 13. In plane 13, then, a real, achromatic image 22a of the probe exists, which is provided by the particles with the energy determined by the size of the dispersion aperture 16, 18, or 20 and the potential of the system.

An image of the angular distribution, in this case, must exist in the plane 23, which forms an angle of $\beta=\alpha/2-\pi/2$ with the plane 13a at the inlet to the region of the concentric electrodes 1 and 2.

The same symmetry conditions must be fulfilled when the electro-optical lens (or a lens system), which is located between the objective and the energy filter, transmits the image of the angular distribution, which exists in the optical plane of the objective, into the plane 13 on the energy filter inlet.

The electro-optical system is necessary in order to fulfill the symmetry conditions for the energy filter and, thereby, to achieve the optimal working point, which leads to the complete minimizing of the imaging error of the energy filter in the plane 13, which now is a plane of the angular distribution.

In plane 13, then, an achromatic image 22a of the angular distribution exists from the region of the probe defined by the dispersion aperture 16 or 20, which is provided by the particles with the energy determined by the size of the dispersion aperture 16, 18, or 20 and the potential of the system.

One or two lens systems located behind the imaging energy filter allow enlarging of the image 22a existing in the symmetry plane 13 at the outlet of the energy filter.

An electro-optical system, which is located between the opening 28 and the signal amplifier 29 (which in this case serves for the image sensing), enables the enlargement and projection of the image that results in the plane 23 if the fragments of the concentric and spherical electrodes 1 and 2 behind the bore 28 have the same potential (in the preferred manner the potential of the central trajectory 14).

In spite of the distortion of the image caused by the slant of the electro-optical axes, the energy filter shown in FIG. 6 offers a simple method for imaging energy analysis, particularly in combination with the immersion objective.

In the field of electro-optical devices, many possibilities exist for using the invention of the imaging energy filter. One of the most important areas is electron microscopy.

In the visualization of the probe, electrons are used, which are reflected or emitted and which have a characteristic energy spectrum for the probe. Chromatic aberrations in the electron microscope without the imaging energy filter cause a significant impairment of the lateral resolution and the quality of the image. Equipping the electron microscope with the energy filter described herein permits the energy-selective imaging of the probe. The selection of the energy is determined by the characteristic electron transition of the probe. By the admission of only the characteristic electrons to the imaging, the energy-selective, two-dimensional information from the energy spectrum is visualized.

The use of the invention in electron microscopy opens also the possibilities of local measurement from the regions defined precisely with the selective area aperture.

The field of application of the invention, however, can be substantially broader and contains many other electro-optical instruments. The image-forming energy filter transmits any image provided by the charged particles from the inlet of the filter to its outlet, without loss of lateral information. By a specific adjustment of the dispersion aperture in one of the described planes, the image at the outlet is provided only by charged particles with defined energies.

Here, any distribution of the charged particles in the symmetry plane 13 on the energy filter inlet serves as the object. In particular, it can be an image of the probe, its intermediate image, an image of the angular distribution or an intermediate image of the angular distribution.

Also an emitter of the charged particles, its image or intermediate image or also its angular distribution or intermediate image of the angular distribution, can be the object of the energy filter, which leads to a monochromatization and, therefore, the improvement of the quality of the beam in the electro-optical system.

The specification incorporates by reference the disclosure of Polish priority document 368 785 filed Jun. 28, 2004.

The present invention is, of course, in no way restricted to the specific disclosure of the specification and drawings, but also encompasses any modifications within the scope of the appended claims.

The invention claimed is:

1. An imaging energy filter for electrons and other charged particles with a total deflection angle of $2\pi$, comprising:
   two concentric and spherical electrodes, which produce an electrostatic field that deflects the charged particles at an angle $\alpha$ that is greater than $\pi$ and less than $2\pi$;
   an inlet having an inlet axis and an outlet having an outlet axis, wherein the outlet axis is a tangent to a central trajectory, along which the charged particles at the outlet move from a region of the concentric electrodes, and wherein the inlet axis is a tangent to the central trajectory, along which the charged particles at the inlet move to the region of the concentric and spherical electrodes; and
   a deflecting element that generates a deflection field, wherein said deflecting element is disposed at an intersection point of the inlet axis and the outlet axis and in a plane of symmetry of the angle $\alpha$, wherein the plane of symmetry simultaneously is an electro-optical plane, wherein the deflecting element deflects the charged particles moving in the direction of the deflecting element from a source along an axis running through the intersecting point of the inlet axis and outlet axis of the concentric and spherical electrodes, wherein the axis is perpendicular to the plane of symmetry of the angle $\alpha$, wherein the charged particles produces an image in the plane of symmetry, wherein the image simultaneously serves as an object of energy filtering, wherein said image is deflected by an angle $\pi-\alpha/2$, so that the particles move further along the inlet axis to the region of the concentric and spherical electrodes, wherein after deflection by an angle $\alpha$, said particles turn back along the outlet axis from the region of the concentric and spherical electrodes to the deflecting element and provide an energetically filtered image at the location of the original object in the plane of symmetry, and wherein the deflection field generated by the deflecting element deflects the charged particles by an angle $\pi-\alpha/2$, leading to a total deflection angle of $2\pi$ and thereby to co-linearity of the inlet axis and outlet axis.

2. The imaging energy filter of claim 1, wherein in the plane of symmetry of the deflection angle $\alpha$ which simultaneously serves as an electro-optical image plane in a region that is distanced at an angle $\alpha/2$ from the inlet to the concentric and spherical electrodes, or in a first plane of an angular distribution of the object or in a second plane of the angular distribution of the object at the location of the central trajectory, a dispersion aperture is disposed, wherein the dispersion screen aperture defines an energy range and a size of the image of the object or an opening angle, wherein the dispersion aperture has a potential corresponding to that of the central trajectory, and wherein the dispersion aperture is screened on two sides with electrodes simulating the field of the concentric and spherical electrodes.

3. The imaging energy filter of claim 1, wherein the deflecting element located at the intersecting point of the inlet axis and outlet axis produces an electrostatic deflection field or a magnetic deflection field or an electrostatic-magnetic defection field.

4. The imaging energy filter of claim 1, wherein elements are mounted at the inlet and outlet of the region of the concentric and spherical electrodes, and wherein said elements simulate the field produced by the concentric and spherical electrodes.

5. The imaging energy filter of claim 1, wherein in an outer, spherical electrode on an axis perpendicular to an image plane and tangential to the central trajectory, an opening is disposed, wherein said opening makes possible a drift of the charged particles and detection or imaging of the particles when the fragments of the concentric and spherical electrodes behind the dispersion aperture have the same potential.

6. The use of an energy filter of claim 1 in an electron microscope.

7. The use of an energy filter of claim 1 in devices for monochromatizing of the electrons or charged particles.

8. The use of an energy filter of claim 1 in measurement devices for time resolved measurement.

9. An imaging energy filter for electrons and other charged particles, comprising:
   two concentric and spherical electrodes which produce an electrostatic field, wherein said electrostatic field deflects the charged particles by an angle $\alpha$ that is greater than $\pi$ and less than $2\pi$; and
   a dispersion aperture located in a plane of symmetry of the deflection angle $\alpha$ serving simultaneously as an electro-optical image plane in a region that is distanced at an angle $\alpha/2$ from the inlet to the concentric and spherical electrodes, or in a first plane of an angular distribution of the object or in a second plane of the angular distribution of the object at the location of the central trajectory, wherein the dispersion aperture defines an energy range and a size of the image of the object or an opening angle, wherein the dispersion aperture has a potential corresponding to that of the central trajectory, and wherein the dispersion aperture is screened on two sides with electrodes simulating the field of the concentric and spherical electrodes.

10. The imaging energy filter of claim 9, wherein in an outer, spherical electrode, an opening is disposed on an axis, and wherein said opening makes possible a drift of the charged particles when the concentric and spherical electrodes at the inlet have the same potential.

* * * * *